United States Patent
Ishida

(10) Patent No.: US 12,532,611 B2
(45) Date of Patent: Jan. 20, 2026

(54) DISPLAY DEVICE AND MANUFACTURING METHOD THEREOF

(71) Applicant: Magnolia White Corporation, Tokyo (JP)

(72) Inventor: Arichika Ishida, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 362 days.

(21) Appl. No.: 18/299,081

(22) Filed: Apr. 12, 2023

(65) Prior Publication Data
US 2023/0371314 A1    Nov. 16, 2023

(30) Foreign Application Priority Data
May 10, 2022  (JP) .................................. 2022-077460

(51) Int. Cl.
*H10K 59/122*    (2023.01)
*H10K 59/12*    (2023.01)

(52) U.S. Cl.
CPC ....... *H10K 59/122* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 6,037,712 A * | 3/2000 | Codama | H10K 59/10 428/917 |
| 6,369,495 B2 | 4/2002 | Codama et al. | |
| 6,626,721 B1 * | 9/2003 | Van Slyke | H10K 59/173 313/506 |
| 7,095,172 B2 * | 8/2006 | Sakamoto | H10K 59/173 313/506 |
| 8,928,018 B2 * | 1/2015 | Ikeda | H10K 59/131 438/22 |
| 2004/0160170 A1 | 8/2004 | Sato et al. | |
| 2009/0009069 A1 | 1/2009 | Takata | |
| 2014/0183501 A1 * | 7/2014 | Kim | H10K 59/122 438/34 |
| 2019/0363275 A1 | 11/2019 | Ochi et al. | |
| 2022/0077251 A1 | 3/2022 | Choung et al. | |
| 2023/0269969 A1 | 8/2023 | Lee et al. | |

FOREIGN PATENT DOCUMENTS

| | | |
|---|---|---|
| CN | 116261925 A | 6/2023 |
| JP | H10-172765 A | 6/1998 |
| JP | 2000-195677 A | 7/2000 |

(Continued)

*Primary Examiner* — Michelle Mandala
(74) *Attorney, Agent, or Firm* — XSENSUS LLP

(57) ABSTRACT

According to one embodiment, a display device includes a lower electrode, a rib covering a part of the lower electrode and including a pixel aperture, a partition surrounds the pixel aperture, an upper electrode facing the lower electrode, and an organic layer between the lower and upper electrodes. The partition includes a conductive lower portion including an annular side surface which surrounds the pixel aperture, and an upper portion including an annular protrusion which protrudes from the side surface. The upper electrode is in contact with the side surface of the lower portion. The protrusion has a constant width over a whole circumference.

7 Claims, 14 Drawing Sheets

(56) References Cited

FOREIGN PATENT DOCUMENTS

| | | | |
|---|---|---|---|
| JP | 2004-207217 | A | 7/2004 |
| JP | 2008-135325 | A | 6/2008 |
| JP | 2009-32673 | A | 2/2009 |
| JP | 2010-118191 | A | 5/2010 |
| WO | 1999026730 | A1 | 6/1999 |
| WO | 2018/179308 | A1 | 10/2018 |

* cited by examiner

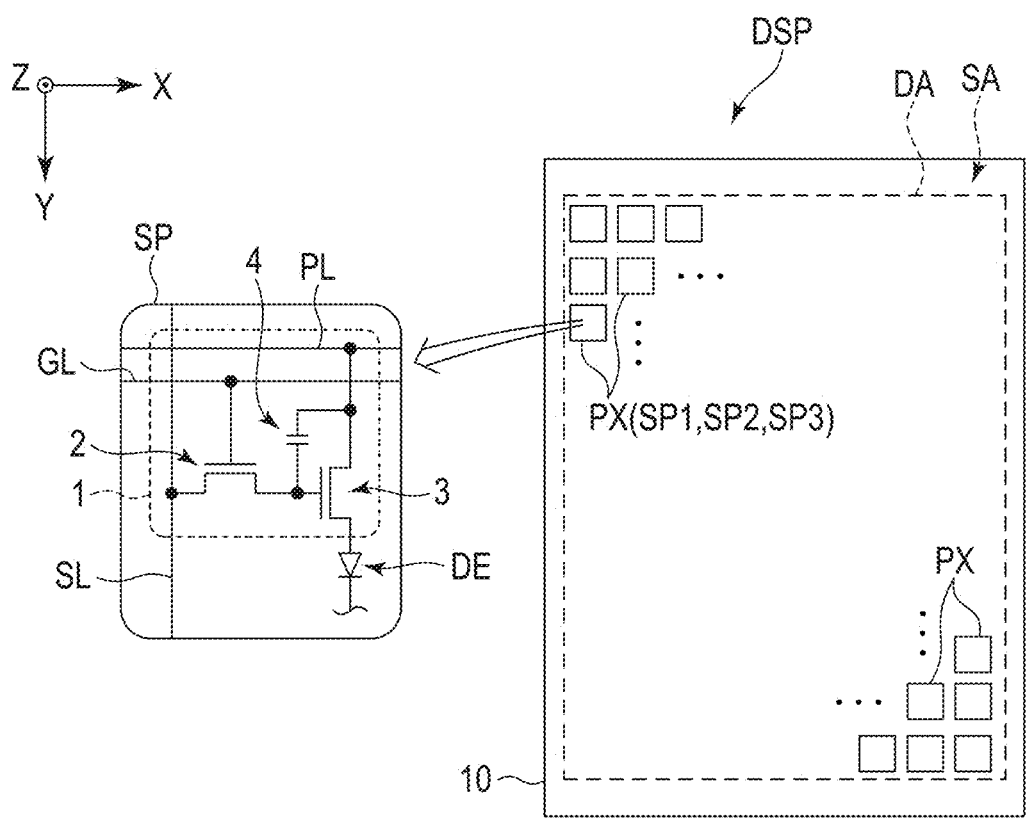
F I G. 1

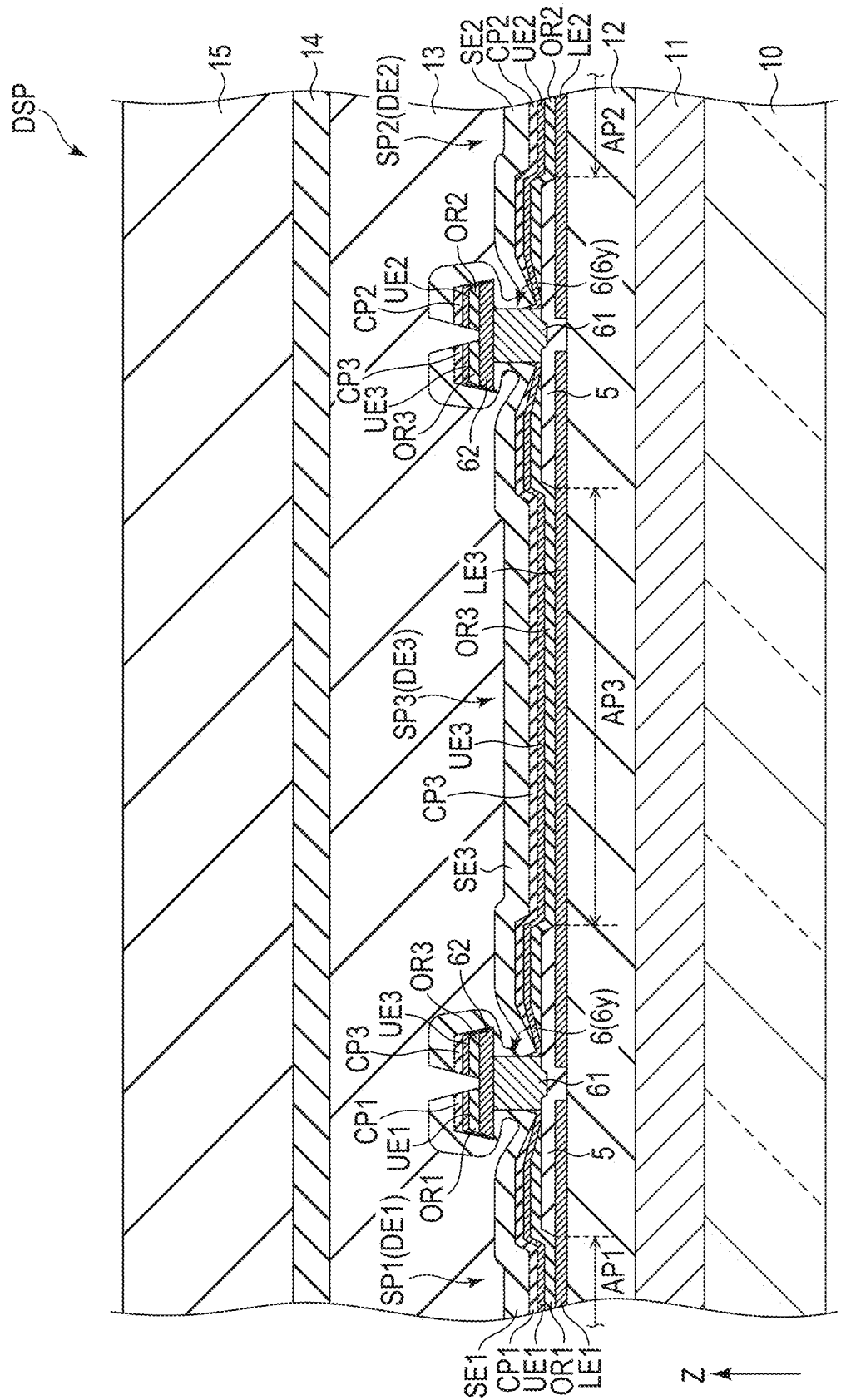
F I G. 3

DISPLAY DEVICE AND MANUFACTURING METHOD THEREOF

CROSS-REFERENCE TO RELATED APPLICATIONS

This application is based upon and claims the benefit of priority from Japanese Patent Application No. 2022-077460, filed May 10, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which prevents the reduction in reliability is required.

BRIEF DESCRIPTION OF THE DRAWINGS

FIG. 1 is a diagram showing a configuration example of a display device according to an embodiment.

FIG. 3 is a schematic cross-sectional view of the display device along the III-III line of FIG. 2.

DETAILED DESCRIPTION

Figure 2:
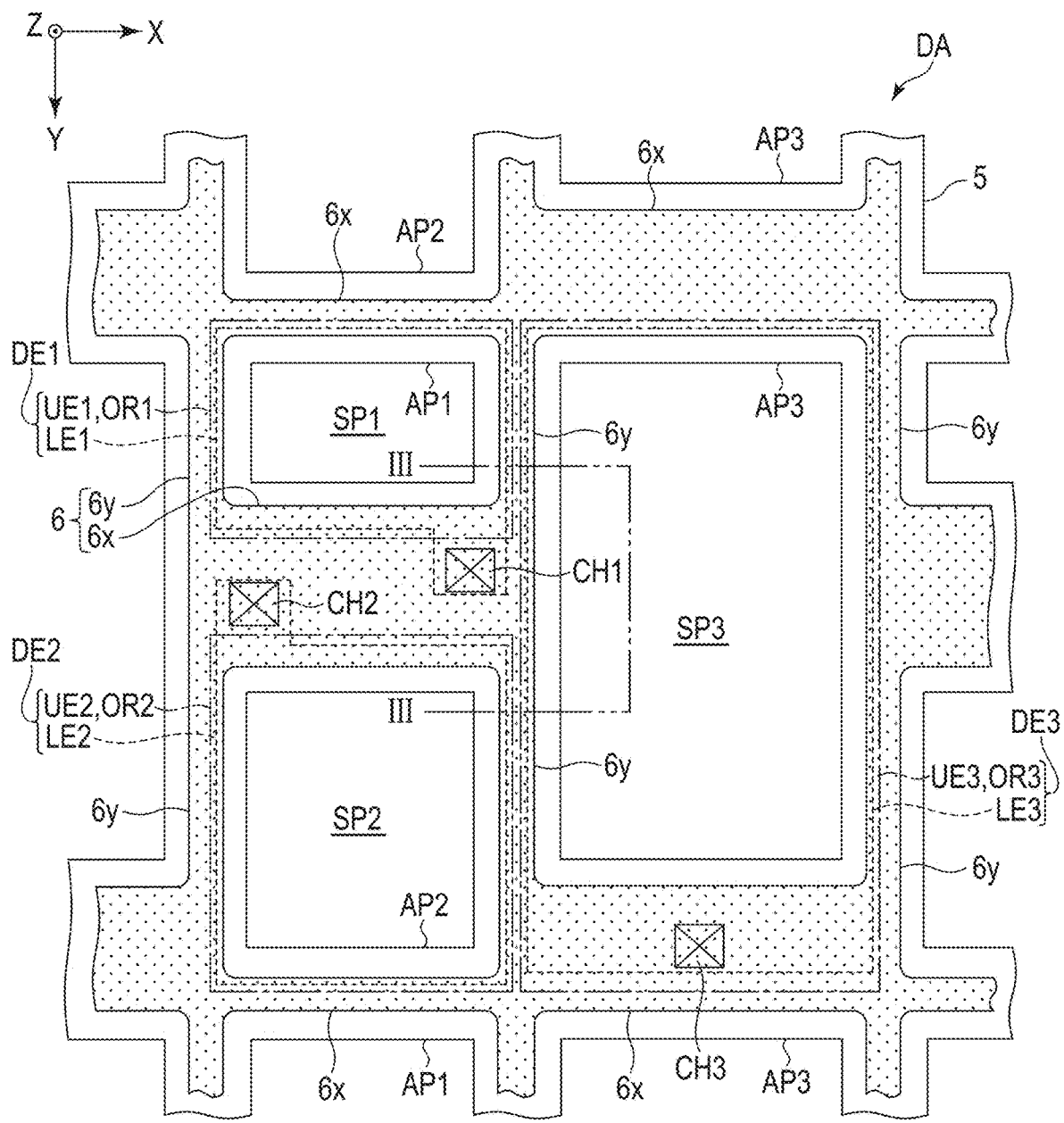
FIG. 2 is a diagram showing an example of the layout of subpixels.

In general, according to one embodiment, a display device comprises a lower electrode, a rib which covers a part of the lower electrode and comprises a pixel aperture overlapping the lower electrode, a partition which is provided on the rib and surrounds the pixel aperture, an upper electrode which faces the lower electrode, and an organic layer which is provided between the lower electrode and the upper electrode and emits light based on a potential difference between the lower electrode and the upper electrode. The partition includes a conductive lower portion comprising an annular side surface which surrounds the pixel aperture, and an upper portion comprising an annular protrusion which protrudes from the side surface. The upper electrode is in contact with the side surface of the lower portion. The protrusion has a constant width over a whole circumference.

According to another embodiment, a manufacturing method of a display device includes forming a lower electrode above a substrate, forming a rib which covers at least part of the lower electrode, forming a metal layer which is a base of a lower portion of a partition on the rib, forming a thin film which is a base of an upper portion of the partition on the metal layer, forming a resist on the thin film, forming the upper portion by removing, of the thin film, a portion exposed from the resist by etching, and forming the lower portion and an annular protrusion having a constant width over a whole circumference by removing, of the metal layer, a portion exposed from the resist by etching and reducing a width of, of the metal layer, a portion located under the resist.

The embodiments can provide a display device in which the reliability can be improved and a manufacturing method thereof.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view. When this specification uses terms indicating the positional relationships of two or more elements, such as "on", "above" and "face" in phrases "an element is provided on another element", "an element is provided above another element" and "an element faces another element", the two or more elements may be directly in contact with each other, or a gap or yet another element may be interposed between the elements.

The display device of the present embodiment is an organic electroluminescent (EL) display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to an embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red first subpixel SP1, a green second subpixel SP2 and a blue third subpixel SP3. Each pixel PX may include a subpixel SP which exhibits another color such as white in addition to subpixels SP1, SP2 and SP3 or instead of one of subpixels SP1, SP2 and SP3. The number of subpixels SP constituting each pixel PX may be less than or equal to two.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

It should be noted that the configuration of the pixel circuit 1 is not limited to the example shown in the figure. For example, the pixel circuit 1 may comprise more thin-film transistors and capacitors.

FIG. 2 is a diagram showing an example of the layout of subpixels SP1, SP2 and SP3. In the example of FIG. 2, the first subpixel SP1 and the third subpixel SP3 are arranged in the first direction X. The second subpixel SP2 and the third subpixel SP3 are also arranged in the first direction X. Further, the first subpixel SP1 and the second subpixel SP2 are arranged in the second direction Y.

When subpixels SP1, SP2 and SP3 are provided in line with this layout, in the display area DA, a column in which subpixels SP1 and SP2 are alternately provided in the second direction Y and a column in which a plurality of third subpixels SP3 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises a first pixel aperture AP1 in the first subpixel SP1, comprises a second pixel aperture AP2 in the second subpixel SP2 and comprises a third pixel aperture AP3 in the third subpixel SP3. In the example of FIG. 2, the second pixel aperture AP2 is larger than the first pixel aperture AP1, and the third pixel aperture AP3 is larger than the second pixel aperture AP2.

The partition 6 is provided in the boundary between adjacent subpixels SP and overlaps the rib 5 as seen in plan view. The partition 6 comprises a plurality of first partitions 6x extending in the first direction X and a plurality of second partitions 6y extending in the second direction Y. The first partitions 6x are provided between the pixel apertures AP1 and AP2 which are adjacent to each other in the second direction Y and between two third pixel apertures AP3 which are adjacent to each other in the second direction Y. Each second partition 6y is provided between the pixel apertures AP1 and AP3 which are adjacent to each other in the first direction X and between the pixel apertures AP2 and AP3 which are adjacent to each other in the first direction X.

In the example of FIG. 2, the first partitions 6x and the second partitions 6y are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

The first subpixel SP1 comprises a first lower electrode LE1, a first upper electrode UE1 and a first organic layer OR1 overlapping the first pixel aperture AP1. The second subpixel SP2 comprises a second lower electrode LE2, a second upper electrode UE2 and a second organic layer OR2 overlapping the second pixel aperture AP2. The third subpixel SP3 comprises a third lower electrode LE3, a third upper electrode UE3 and a third organic layer OR3 overlapping the third pixel aperture AP3.

The first lower electrode LE1, the first upper electrode UE1 and the first organic layer OR1 constitute the first display element DE1 of the first subpixel SP1. The second lower electrode LE2, the second upper electrode UE2 and the second organic layer OR2 constitute the second display element DE2 of the second subpixel SP2. The third lower electrode LE3, the third upper electrode UE3 and the third organic layer OR3 constitute the third display element DE3 of the third subpixel SP3. Each of the display elements DE1, DE2 and DE3 may include a cap layer as described later.

The first lower electrode LE1 is connected to the pixel circuit 1 (see FIG. 1) of the first subpixel SP1 through a first contact hole CH1. The second lower electrode LE2 is connected to the pixel circuit 1 of the second subpixel SP2 through a second contact hole CH2. The third lower electrode LE3 is connected to the pixel circuit 1 of the third subpixel SP3 through a third contact hole CH3.

In the example of FIG. 2, the contact holes CH1 and CH2 entirely overlap the first partition 6X between the pixel apertures AP1 and AP2 which are adjacent to each other in the second direction Y. The third contact hole CH3 entirely overlaps the first partition 6x between the two third pixel apertures AP3 which are adjacent to each other in the second direction Y. As another example, at least part of the contact hole CH1, CH2 or CH3 may not overlap the first partition 6x.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3, and comprises the pixel apertures AP1, AP2 and AP3 described above. Each of the lower electrodes LE1, LE2 and LE3 is partly covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 is called an overhang shape.

The first organic layer OR1 covers the first lower electrode LE1. The first upper electrode UE1 covers the first organic layer OR1 and faces the first lower electrode LE1. The second organic layer OR2 covers the second lower electrode LE2. The second upper electrode UE2 covers the second organic layer OR2 and faces the second lower electrode LE2. The third organic layer OR3 covers the third lower electrode LE3. The third upper electrode UE3 covers the third organic layer OR3 and faces the third lower electrode LE3.

In the example of FIG. 3, a first cap layer CP1 is provided on the first upper electrode UE1. A second cap layer CP2 is provided on the second upper electrode UE2. A third cap layer CP3 is provided on the third upper electrode UE3. The cap layers CP1, CP2 and CP3 adjust the optical property of the light emitted from the organic layers OR1, OR2 and OR3, respectively.

The first organic layer OR1, the first upper electrode UE1 and the first cap layer CP1 are partly located on the upper portion 62. These portions are spaced apart from the other portions of the first organic layer OR1, the first upper electrode UE1 and the first cap layer CP1. Similarly, the second organic layer OR2, the second upper electrode UE2 and the second cap layer CP2 are partly located on the upper portion 62, and these portions are spaced apart from the other portions of the second organic layer OR2, the second upper electrode UE2 and the second cap layer CP2. Further, the third organic layer OR3, the third upper electrode UE3 and the third cap layer CP3 are partly located on the upper portion 62, and these portions are spaced apart from the other portions of the third organic layer OR3, the third upper electrode UE3 and the third cap layer CP3.

A first sealing layer SE1 is provided in the first subpixel SP1. A second sealing layer SE2 is provided in the second subpixel SP2. A third sealing layer SE3 is provided in the third subpixel SP3. The first sealing layer SE1 continuously covers the first cap layer CP1 and the partition 6 around the first subpixel SP1. The second sealing layer SE2 continuously covers the second cap layer CP2 and the partition 6 around the second subpixel SP2. The third sealing layer SE3 continuously covers the third cap layer CP3 and the partition 6 around the third subpixel SP3.

The end portions (peripheral portions) of the sealing layers SE1, SE2 and SE3 are located above the upper portions 62. In the example of FIG. 3, the first organic layer OR1, the first upper electrode UE1, the first cap layer CP1 and the first sealing layer SE1 located on the upper portion 62 of the left partition 6 are spaced apart from the third organic layer OR3, the third upper electrode UE3, the third cap layer CP3 and the third sealing layer SE3 located on this upper portion 62. The second organic layer OR2, the second upper electrode UE2, the second cap layer CP2 and the second sealing layer SE2 located on the upper portion 62 of the right partition 6 are spaced apart from the third organic layer OR3, the third upper electrode UE3, the third cap layer CP3 and the third sealing layer SE3 located on this upper portion 62.

The sealing layers SE1, SE2 and SE3 are covered with a resin layer 13. The resin layer 13 is covered with a sealing layer 14. Further, the sealing layer 14 is covered with a resin layer 15.

The organic insulating layer 12 and the resin layers 13 and 15 are formed of organic materials. The rib 5 and the sealing layers 14, SE1, SE2 and SE3 are formed of, for example, inorganic materials such as silicon nitride (SiN), silicon oxide (SiO) and silicon oxynitride (SiON).

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

The upper electrodes UE1, UE2 and UE3 are formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

Each of the organic layers OR1, OR2 and OR3 includes a plurality of functional layers and a light emitting layer. For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. It should be noted that the configuration of the organic layer OR1, OR2 or OR3 is not limited to this example. One of the functional layers described above may be omitted. Another functional layer may be added.

Each of the cap layers CP1, CP2 and CP3 is formed by, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the material of the upper electrodes UE1, UE2 and UE3 and are also different from the material of the sealing layers SE1, SE2 and SE3. It should be noted that at least one of the cap layers CP1, CP2 and CP3 may be omitted.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the first lower electrode LE1 and the first upper electrode UE1, the light emitting layer of the first organic layer OR1 emits light in a red wavelength range. When a potential difference is formed between the second lower electrode LE2 and the second upper electrode UE2, the light emitting layer of the second organic layer OR2 emits light in a green wavelength range. When a potential difference is formed between the third lower electrode LE3 and the third upper electrode UE3, the light emitting layer of the third organic layer OR3 emits light in a blue wavelength range.

Figure 4:
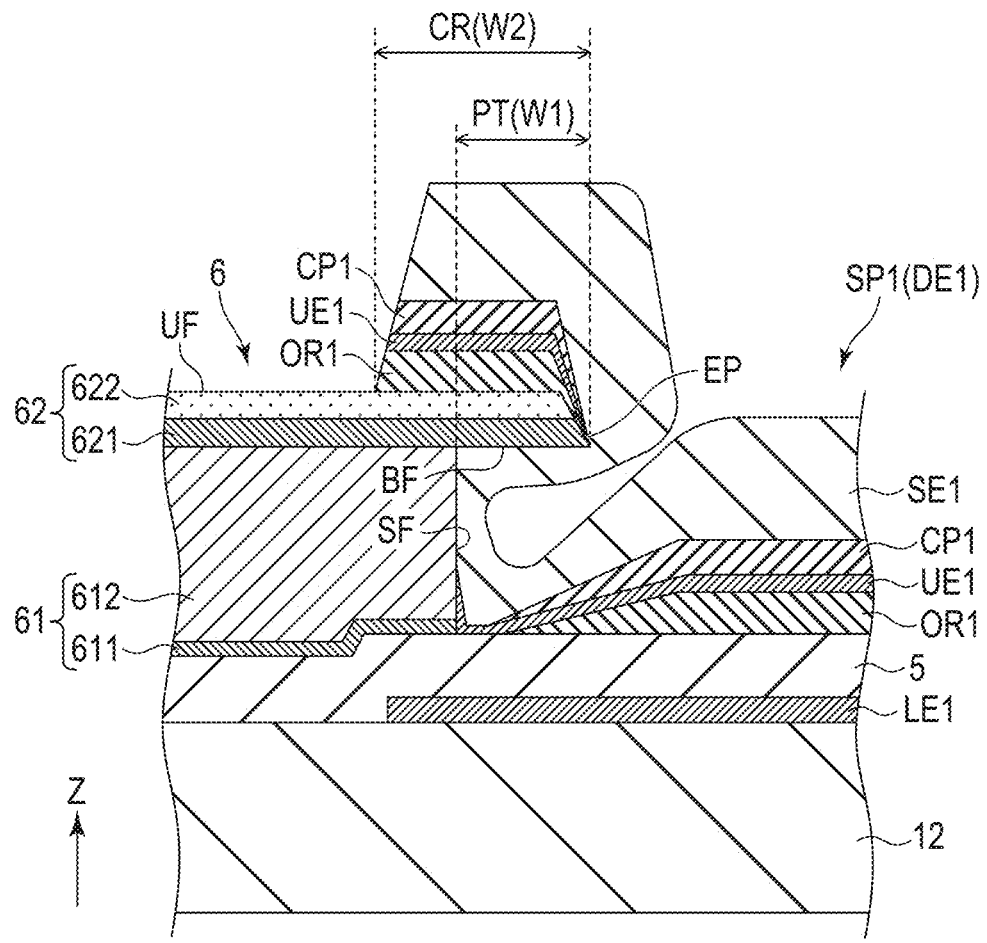
FIG. 4 is a diagram showing an example of a structure which could be applied to a partition and its vicinity.

FIG. 4 is a diagram showing an example of a structure which could be applied to the partition 6 and its vicinity. This figure shows, of the partition 6, a portion which is adjacent to the first subpixel SP1. It should be noted that a similar structure can be applied to, of the partition 6, portions which are adjacent to subpixels SP2 and SP3.

In the example of FIG. 4, the lower portion 61 of the partition 6 comprises a first metal layer 611 which covers the rib 5, and a second metal layer 612 provided on the first metal layer 611. The second metal layer 612 is formed so as to be sufficiently thicker than the first metal layer 611.

For example, the first metal layer 611 is formed of molybdenum (Mo), and the second metal layer 612 is formed of aluminum (Al). As other examples, the second metal layer 612 may be formed of an aluminum alloy such as aluminum-neodymium alloy (AlNd) or may comprise a multilayer structure of aluminum and an aluminum alloy. The first metal layer 611 may comprise a single-layer structure of aluminum or an aluminum alloy.

In the example of FIG. 4, the upper portion 62 of the partition 6 comprises a first thin film 621 provided on the lower portion 61, and a second thin film 622 which covers the first thin film 621. These thin films 621 and 622 are formed so as to be thinner than the lower portion 61. For example, the thickness of the upper portion 62 comprising the thin films 621 and 622 is less than or equal to a third of the thickness of the lower portion 61 and should be preferably less than or equal to a quarter of the thickness of the lower portion 61. Specifically, for example, the thickness of the lower portion 61 is approximately 1000 nm, and the thickness of the upper portion 62 is 100 to 200 nm.

For example, the first thin film 621 is formed of a metal material such as titanium (Ti), and the second thin film 622 is formed of conductive oxide such as ITO, IZO or IGZO. As another example, the upper portion 62 may comprise a single-layer structure of a metal material such as titanium. Alternatively, the upper portion 62 may comprise a single-layer structure of an inorganic material such as silicon oxide.

The lower portion 61 comprises a side surface SF. In the example of FIG. 4, the side surface SF is substantially parallel to a third direction Z. As another example, the side surface SF may incline with respect to the third direction Z such that the lower portion 61 tapers toward the upper side.

The first upper electrode UE1 of the first display element DE1 is in contact with at least part of the side surface SF. The first organic layer OR1 of the first display element DE1 is not in contact with the side surface SF and is covered with the first upper electrode UE1 as a whole. The first cap layer CP1 may not be in contact with the side surface SF as shown in FIG. 4 or may be in contact with the side surface SF.

For example, the end portion of the first lower electrode LE1 is located under the lower portion 61. By this configuration, in FIG. 4, the step of the rib 5 caused by the first lower electrode LE1 is covered with the lower portion 61.

The upper portion 62 comprises a protrusion PT which protrudes from the side surface SF in the width direction of the partition 6 (in other words, a direction orthogonal to the third direction Z). The upper portion 62 comprises an upper surface UF and the lower surface BF of the protrusion PT.

On the upper surface UF, the first organic layer OR1, the first upper electrode UE1 and the first cap layer CP1 are partly provided. The first sealing layer SE1 continuously covers the first display element DE1, the side surface SF, the protrusion PT (lower surface BF) and, of the first organic layer OR1, the first upper electrode UE1 and the first cap layer CP1, the portions provided on the protrusion PT.

In the following descriptions, of the upper surface UF, the portion which is covered with the first organic layer OR1, the first upper electrode UE1 and the first cap layer CP1 is called a covered area CR. As shown in FIG. 3, the upper surface UF also includes a portion which is not covered with any of the organic layers OR1, OR2 and OR3, the upper electrodes UE1, UE2 and UE3, the cap layers CP1, CP2 and CP3 and the sealing layers SE1, SE2 and SE3.

In the example of FIG. 4, the upper surface UF in the protrusion PT is entirely included in the covered area CR. Further, the width W1 of the protrusion PT is less than the width W2 of the covered area CR. As another example, width W1 may be greater than width W2. Width W1 is equivalent to the length of the partition 6 in the width direction from the side surface SF to the end portion EP of the protrusion PT.

Figure 5:
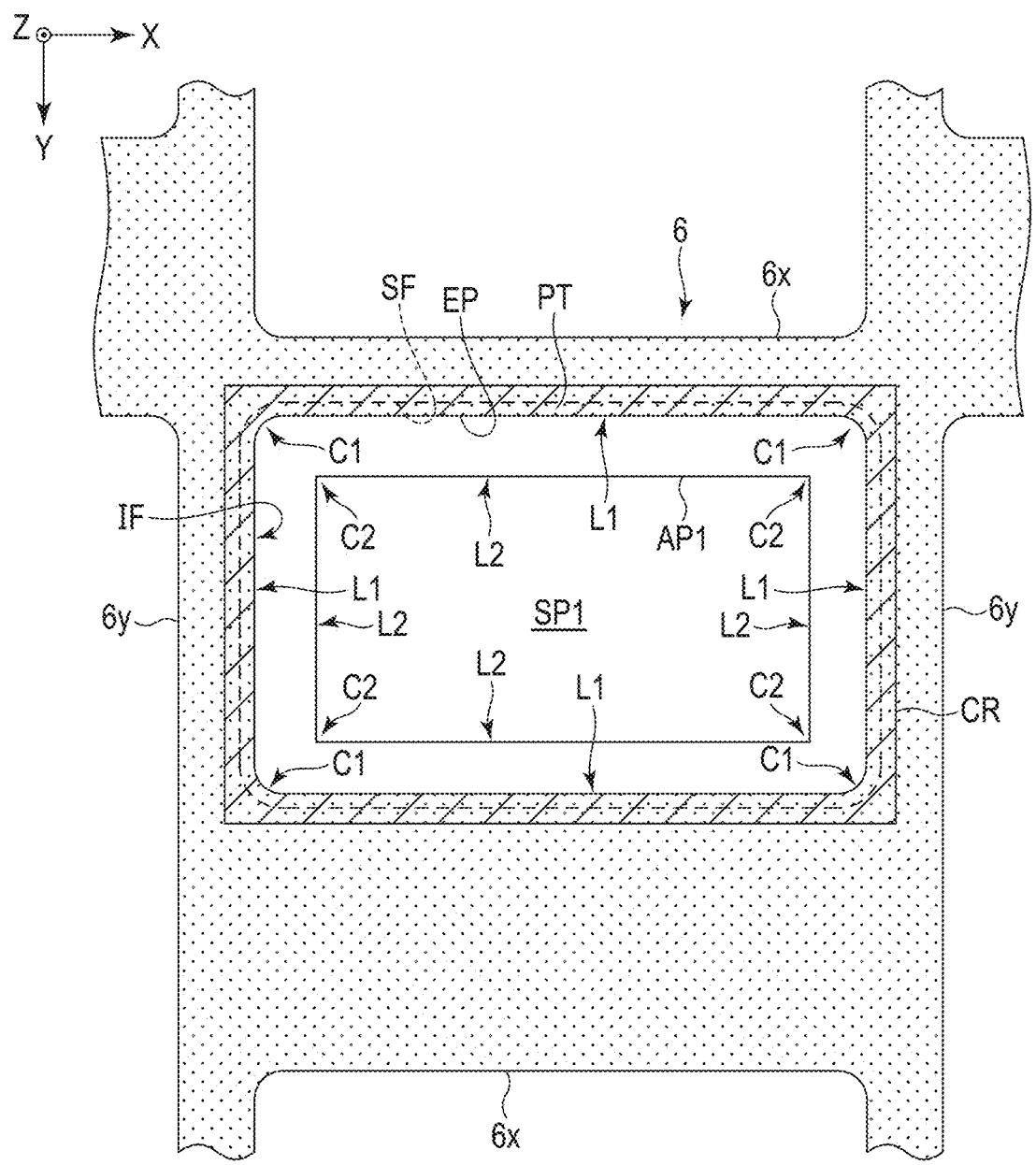
FIG. 5 is a schematic plan view showing the shape of the partition which surrounds a first subpixel.

FIG. 5 is a schematic plan view showing the shape of the partition 6 which surrounds the first subpixel SP1. In the example of FIG. 5, the first pixel aperture AP1 and the inner peripheral portion IF of the partition 6 which surrounds the first pixel aperture AP1 are rectangular.

The inner peripheral portion IF comprises four first linear portions L1, and four first corner portions C1 each connecting adjacent two first linear portions L1. The first pixel aperture AP1 comprises four second linear portions L2 parallel to the four first linear portions L1, respectively, and four second corner portions C2 each connecting adjacent two second linear portions L2. The inner peripheral portion IF or the first pixel aperture AP1 is not limited to a rectangle.

The inner peripheral portion IF includes the side surface SF and end portion EP shown in FIG. 4. As seen in plan view, each of the side surface SF and the end portion EP has an annular shape which surrounds the first pixel aperture AP1. In FIG. 5, the portion between the side surface SF and the end portion EP corresponds to the protrusion PT. As seen in plan view, the protrusion PT also has an annular shape which surrounds the first pixel aperture AP1.

The portion indicated by hatch lines in FIG. 5 corresponds to the covered area CR described above. As seen in plan view, the covered area CR has an annular shape which surrounds the first pixel aperture AP1. In the example of FIG. 5, the covered area CR overlaps the entire protrusion PT.

Figure 6:
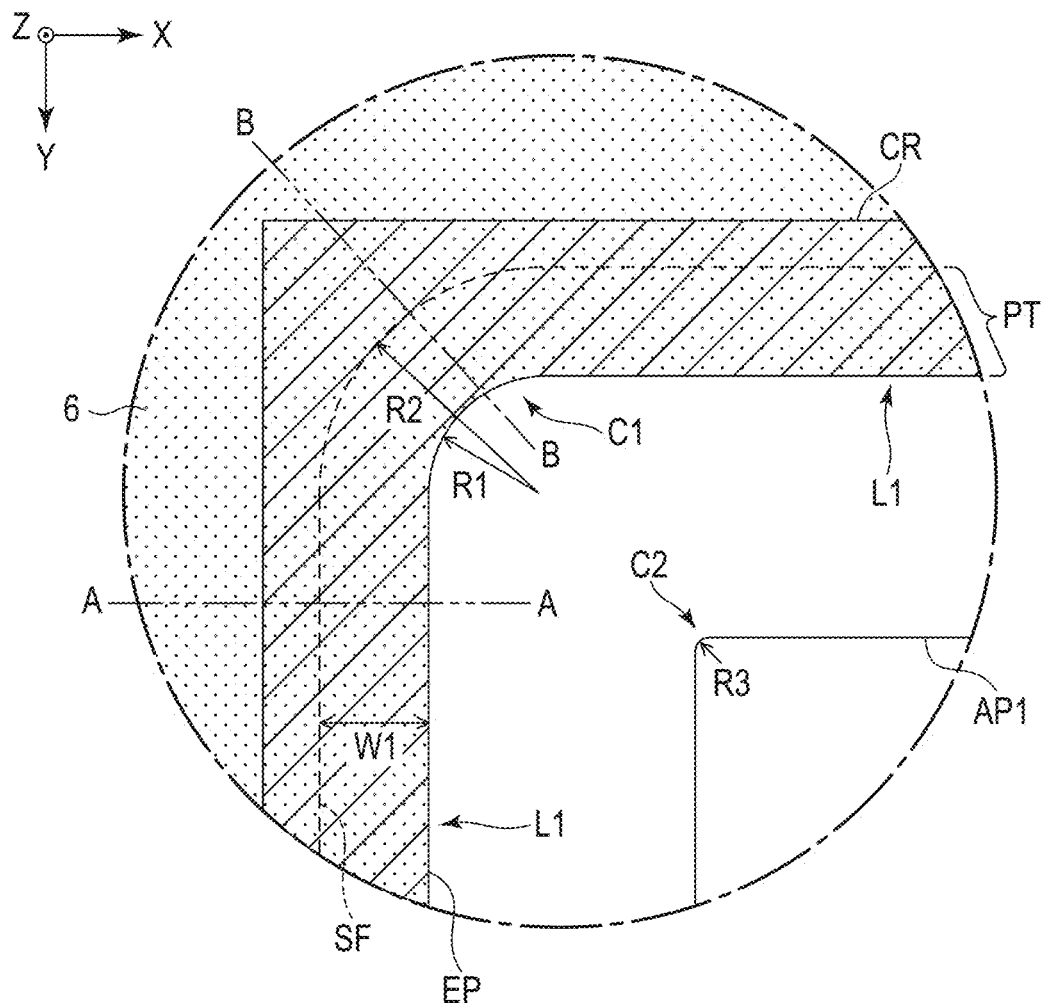
FIG. 6 is a schematic plan view in which the vicinity of a corner portion of the partition is enlarged.

FIG. 6 is a schematic plan view in which the vicinity of the first corner portion C1 is enlarged. The side surface SF extends in the first direction X or the second direction Y in the first linear portion L1 and arcuately extends in the first corner portion C1. Similarly, the end portion EP of the protrusion PT extends in the first direction X or the second direction Y in the first linear portion L1 and arcuately extends in the first corner portion C1.

In the present embodiment, the width W1 of the protrusion PT is constant over the whole circumference of the protrusion PT. To realize this configuration, the radius of curvature R1 of the end portion EP in the first corner portion C1 is less than the radius of curvature R2 of the side surface SF in the first corner portion C1. In other words, the curvature of the end portion EP in the first corner portion C1 is greater than that of the side surface SF in the first corner portion C1.

In the example of FIG. 6, the first pixel aperture AP1 arcuately extends in the second corner portion C2. The radius of curvature R3 of the first pixel aperture AP1 in the second corner portion C2 is less than radius of curvature R1.

In other words, the curvature of the end portion EP in the first corner portion C1 is less than that of the first pixel aperture AP1 in the second corner portion C2.

The section of the display device DSP at the position indicated by each of the A-A and B-B lines of FIG. 6 is similar to the section shown in FIG. 4. In other words, in both the first linear portion L1 and the first corner portion C1, the protrusion PT has width W1, and the first upper electrode UE1 is in contact with the side surface SF.

FIG. 4 to FIG. 6 shows the structure of the first subpixel SP1 and the partition 6 in the vicinity of the first subpixel SP1 as an example. It should be noted that a similar structure can be applied to the other subpixels SP2 and SP3 and the partition 6.

Now, this specification explains the manufacturing method of the display device DSP.

Each of FIG. 7 to FIG. 17 is a schematic cross-sectional view showing part of the manufacturing process of the display device DSP. In FIG. 7 to FIG. 17, the substrate 10 and the circuit layer 11 are omitted.

Figure 7:
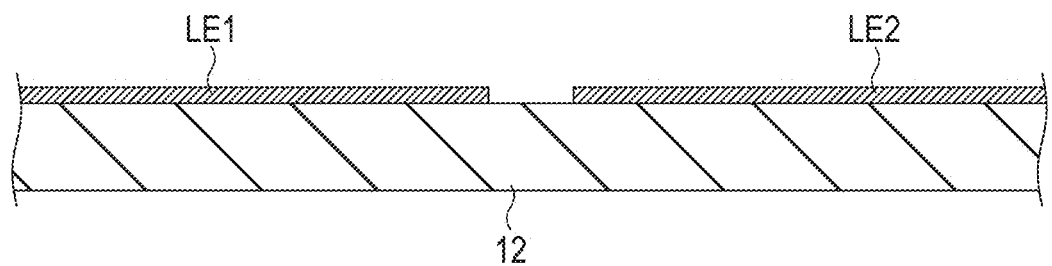
FIG. 7 is a schematic cross-sectional view showing part of the manufacturing process of the display device according to the embodiment.

To manufacture the display device DSP, first, the circuit layer 11 and the organic insulating layer 12 are formed on the substrate 10. Further, as shown in FIG. 7, the lower electrodes LE1, LE2 and LE3 are formed on the organic insulating layer 12.

Figure 8:
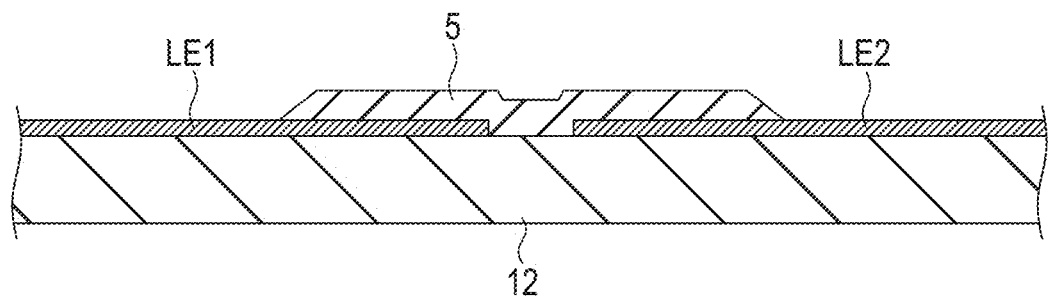
FIG. 8 is a schematic cross-sectional view showing a process following FIG. 7.

Subsequently, as shown in FIG. 8, the rib 5 which covers the end portions of the lower electrodes LE1, LE2 and LE3 is formed. It should be noted that the pixel apertures AP1, AP2 and AP3 may be formed before the process of FIG. 9 or may be formed after the process of FIG. 9 to FIG. 12.

Figure 9:
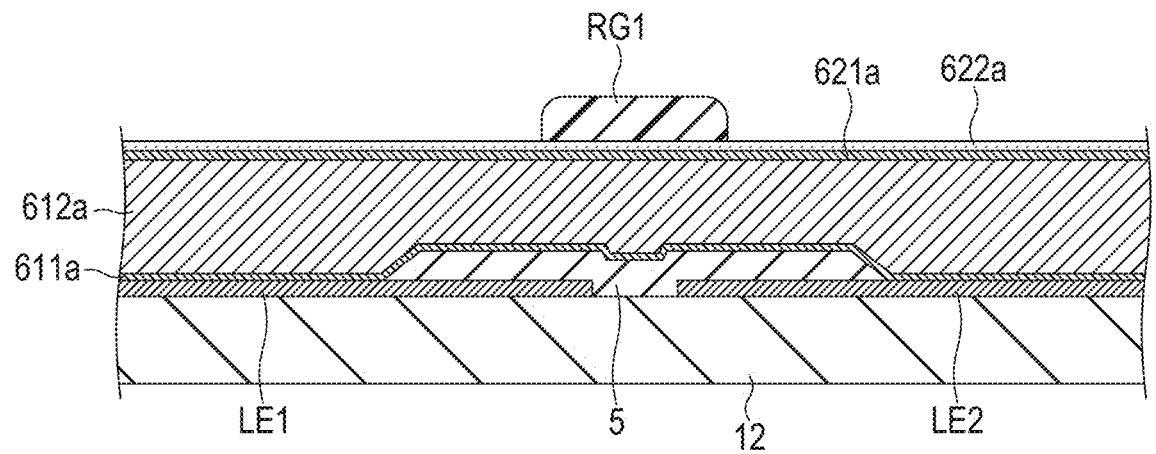
FIG. 9 is a schematic cross-sectional view showing a process following FIG. 8.

After the formation of the rib 5, the partition 6 is formed. Specifically, as shown in FIG. 9, first, a metal layer 611*a* which is the base of the first metal layer 611 is formed on the rib 5. On the metal layer 611*a*, a metal layer 612*a* which is the base of the second metal layer 612 is formed. On the metal layer 612*a*, a thin film 621*a* which is the base of the first thin film 621 is formed. On the thin film 621*a*, a thin film 622*a* which is the base of the second thin film 622 is formed. Further, a resist RG1 based on the shape of the partition 6 is formed on the thin film 622*a*. The thin films 621*a* and 622*a* are sufficiently thinner than the metal layer 612*a*.

Figure 10:
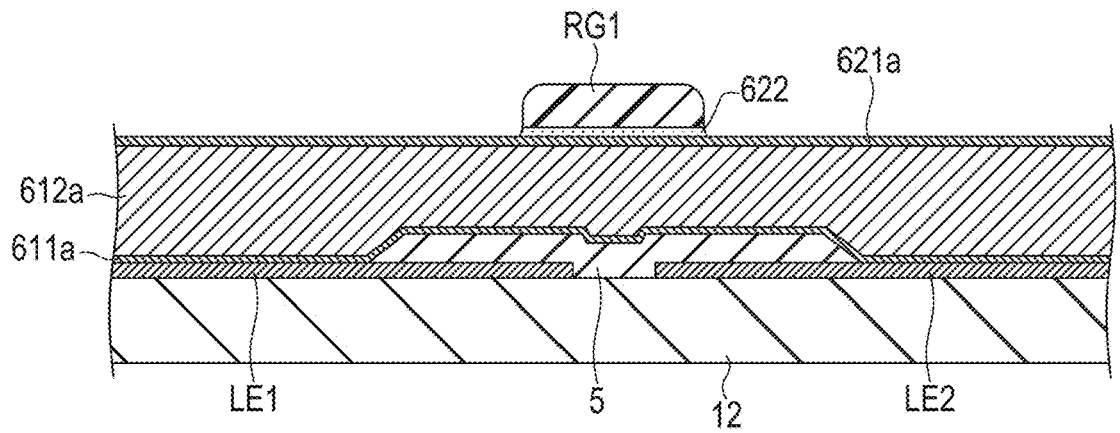
FIG. 10 is a schematic cross-sectional view showing a process following FIG. 9.

Subsequently, as shown in FIG. 10, of the thin film 622*a*, the portion exposed from the resist RG1 is removed by etching using the resist RG1 as a mask. In this way, the second thin film 622 shown in FIG. 4 is formed. For example, when the thin film 622*a* is formed of conductive oxide such as ITO, the etching for the thin film 622*a* may be wet etching.

Figure 11:
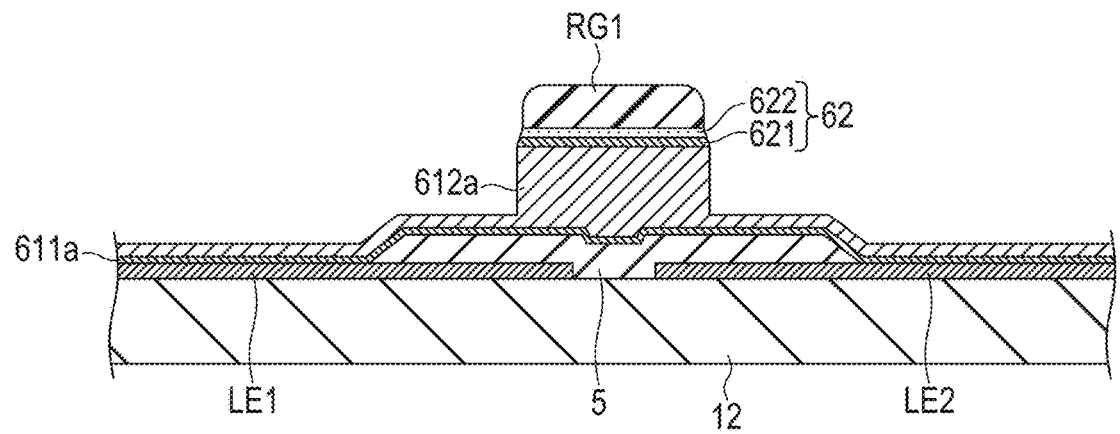
FIG. 11 is a schematic cross-sectional view showing a process following FIG. 10.

Further, as shown in FIG. 11, of the thin film 621*a* and the metal layer 612*a*, the portions exposed from the resist RG1 are removed by anisotropic dry etching using the resist RG1 as a mask. In this way, the upper portion 62 including the first thin film 621 and the second thin film 622 shown in FIG. 4 is formed. In the example of FIG. 11, of the metal layer 612*a*, the portion exposed from the resist RG1 partly remains.

Figure 12:
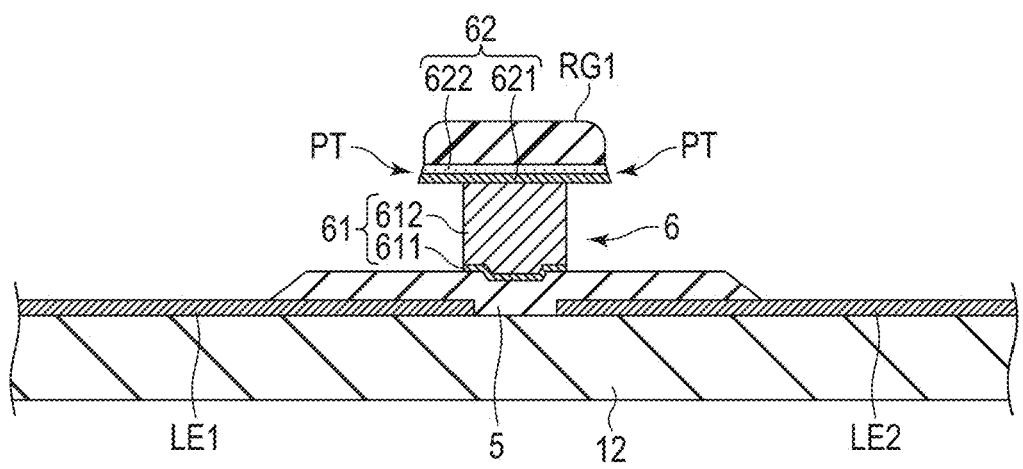
FIG. 12 is a schematic cross-sectional view showing a process following FIG. 11.

Subsequently, isotropic wet etching is applied to the metal layers 611*a* and 612*a*. By this wet etching, as shown in FIG. 12, of the metal layers 611*a* and 612*a*, the portions exposed from the resist RG1 are removed. Further, of the metal layers 611*a* and 612*a*, the width of the portions located under the resist RG1 is reduced. In this way, the lower portion 61 including the first metal layer 611 and the second metal layer 612 shown in FIG. 4 is formed. Further, the protrusion PT of the upper portion 62 is formed.

The planar protrusion PT shown in FIG. 6 can be obtained by patterning the resist RG1 such that the outline of the resist RG1 in the first corner portion C1 is arcuate. The upper portion 62 is thinner than the lower portion 61. Further, at least the first thin film 621 is formed by the anisotropic dry etching described above. Thus, the upper portion 62 having a shape similar to that of the resist RG1 can be stably formed. The arcuate side surface SF in the first corner portion C1 is formed as the metal layers 611*a* and 612*a* isotropically corrode in the isotropic wet etching described above.

After the formation of the partition 6, the resist RG1 is removed. A process for forming the display elements DE1, DE2 and DE3 is performed. In the present embodiment, for example, this specification assumes a case where the third display element DE3 is formed firstly, and the second display element DE2 is formed secondly, and the first display element DE1 is formed lastly. It should be noted that the formation order of the display elements DE1, DE2 and DE3 is not limited to this example.

Figure 13:
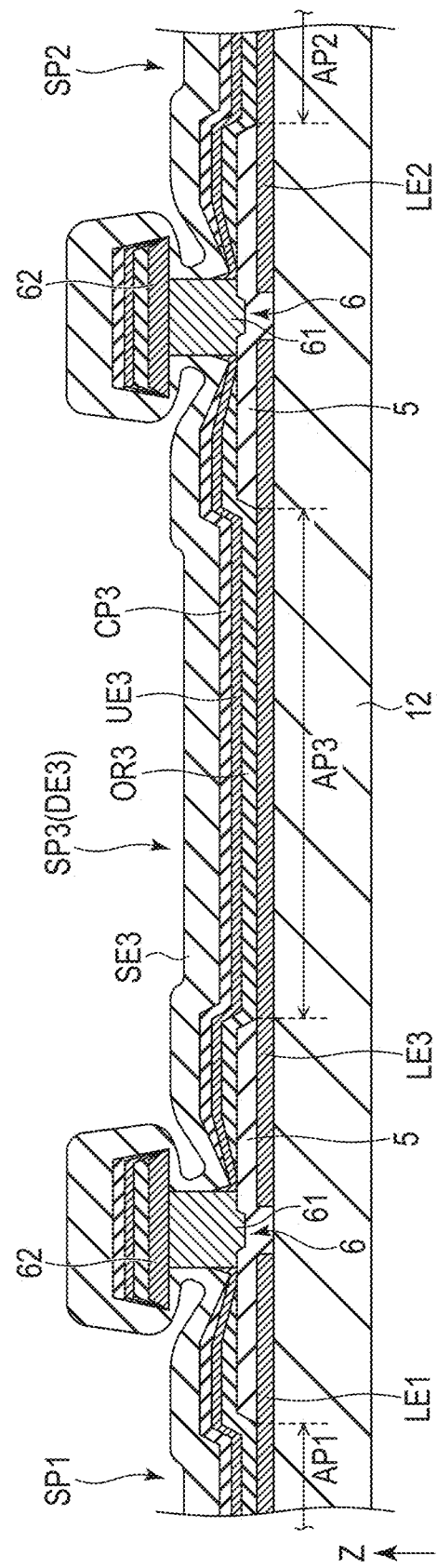
FIG. 13 is a schematic cross-sectional view showing a process following FIG. 12.

To form the third display element DE3, first, as shown in FIG. 13, the third organic layer OR3, the third upper electrode UE3, the third cap layer CP3 and the third sealing layer SE3 are formed in order by vapor deposition for the entire substrate. At this time, the third organic layer OR3, the third upper electrode UE3 and the third cap layer CP3 formed in subpixels SP1, SP2 and SP3 are divided by the partition 6 having an overhang shape. The third sealing layer SE3 continuously covers the third display element DE3 including the third lower electrode LE3, the third organic layer OR3, the third upper electrode UE3 and the third cap layer CP3 and the partition 6.

Figure 14:
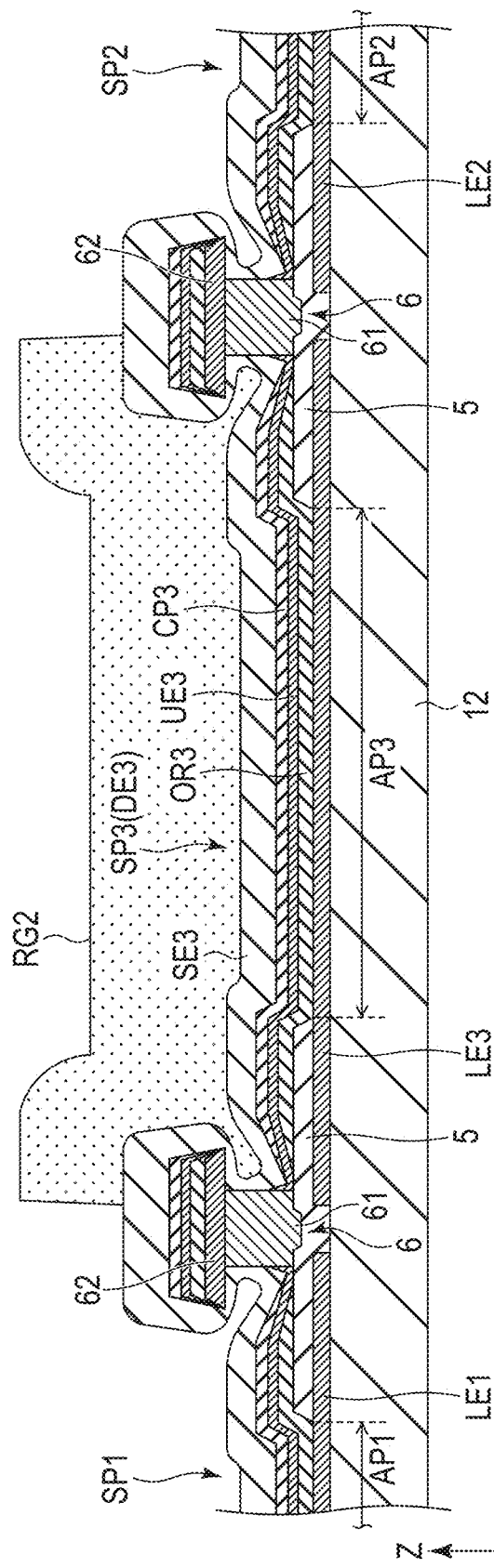
FIG. 14 is a schematic cross-sectional view showing a process following FIG. 13.

Subsequently, as shown in FIG. 14, a resist RG2 is provided on the third sealing layer SE3. The resist RG2 has been patterned so as to overlap the third subpixel SP3. The resist RG2 is also located above, of the partition 6 surrounding the third subpixel SP3, a portion which is close to the third subpixel SP3.

Figure 15:
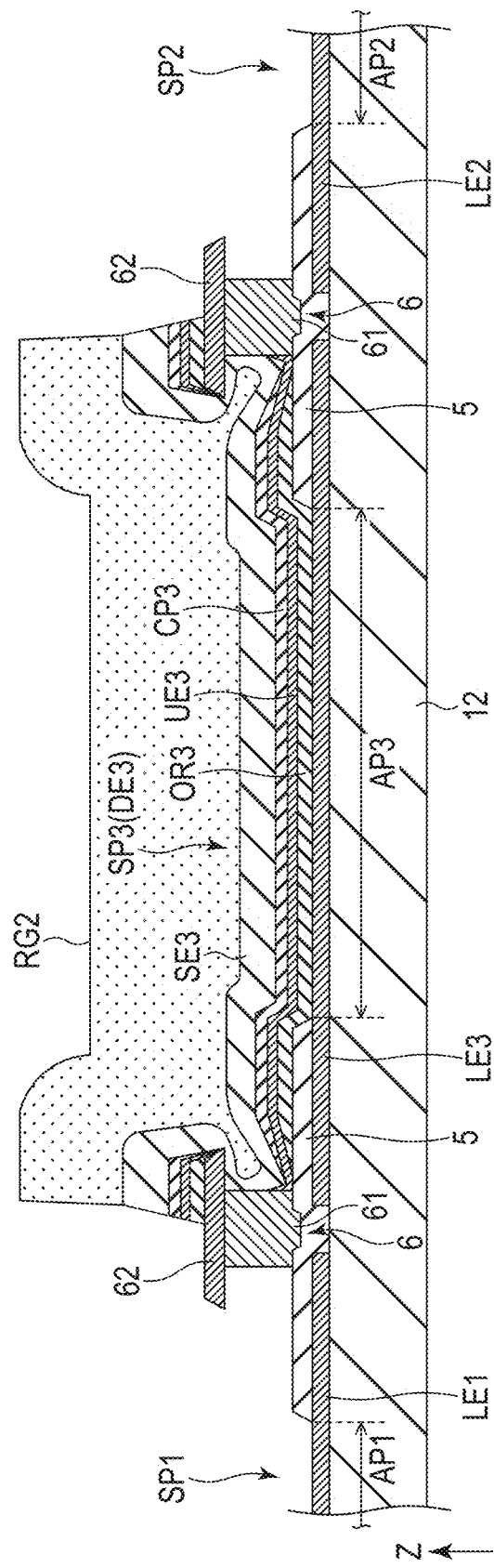
FIG. 15 is a schematic cross-sectional view showing a process following FIG. 14.

Further, of the third organic layer OR3, the third upper electrode UE3, the third cap layer CP3 and the third sealing layer SE3, the portions exposed from the resist RG2 are removed as shown in FIG. 15 by etching using the resist RG2 as a mask. This process enables the acquisition of the following substrate. In the third subpixel SP3, the third display element DE3 including the third lower electrode LE3, the third organic layer OR3, the third upper electrode UE3 and the third cap layer CP3 is formed, and the third sealing layer SE3 which covers the third display element DE3 is also formed. No display element or sealing layer is formed in subpixel SP1 or SP2.

The etching in the process of FIG. 15 includes, for example, dry etching for the third sealing layer SE3, wet etching or ashing for the third cap layer CP3, wet etching for the third upper electrode UE3 and ashing for the third organic layer OR3. In the dry etching for the third sealing layer SE3, the third cap layer CP3 and the third organic layer OR3 function as etching stopper layers.

Figure 16:
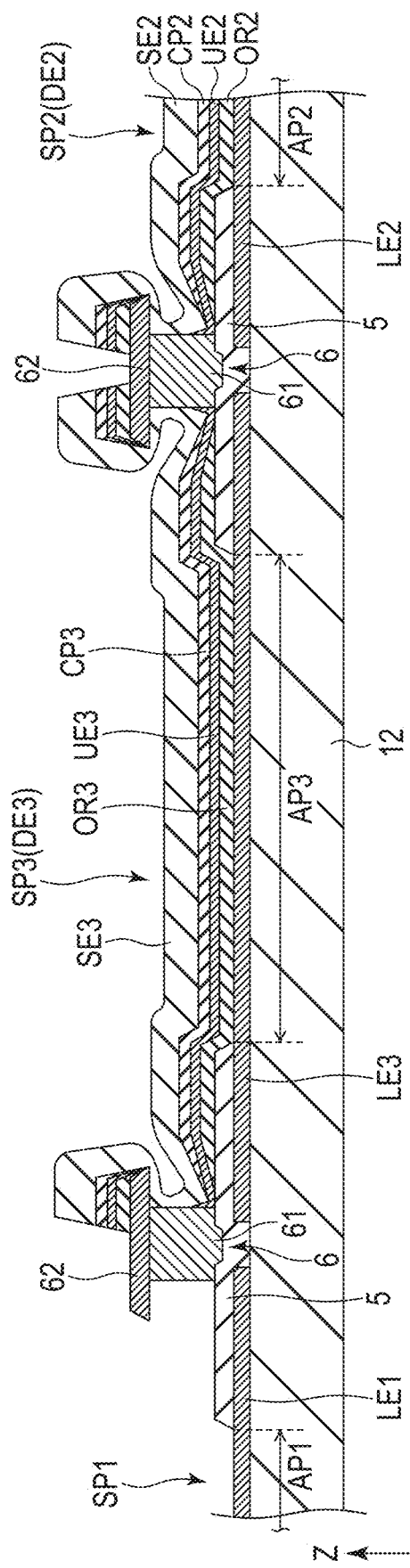
FIG. 16 is a schematic cross-sectional view showing a process following FIG. 15.

Subsequently, the resist RG2 is removed, and a process for forming the second display element DE2 in the second subpixel SP2 is performed by a procedure similar to that of the third display element DE3. This process enables the acquisition of the following substrate. As shown in FIG. 16, further, in the second subpixel SP2, the second display element DE2 including the second lower electrode LE2, the second organic layer OR2, the second upper electrode UE2 and the second cap layer CP2 is formed, and the second sealing layer SE2 which covers the second display element DE2 is also formed.

Figure 17:
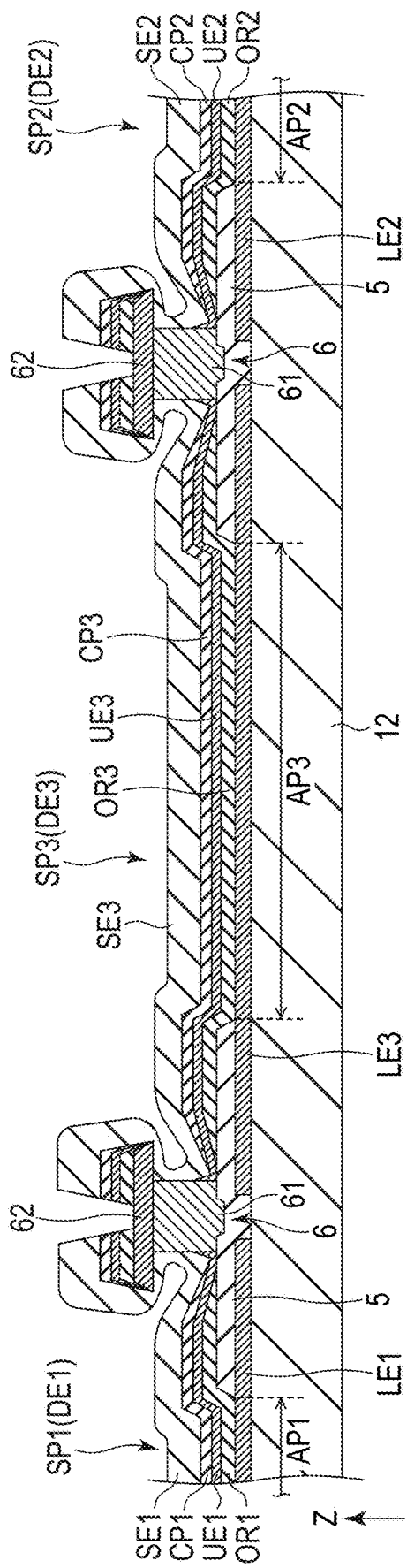
FIG. 17 is a schematic cross-sectional view showing a process following FIG. 16.

After the formation of the second display element DE2, a process for forming the first display element DE1 in the first subpixel SP1 is performed by a procedure similar to that of the third display element DE3. This process enables the acquisition of the following substrate. As shown in FIG. 17, further, in the first subpixel SP1, the first display element DE1 including the first lower electrode LE1, the first organic layer OR1, the first upper electrode UE1 and the first cap layer CP1 is formed, and the first sealing layer SE1 which covers the first display element DE1 is also formed.

Subsequently, the processes of forming the resin layer 13, the sealing layer 14 and the resin layer 15 are performed in series. In this way, the display device DSP comprising the structure shown in FIG. 3 is completed.

In the present embodiment described above, the protrusion PT of the partition 6 surrounding each of the pixel apertures AP1, AP2 and AP3 has a constant width over the whole circumference. If the width of the protrusion PT is locally too great, the upper electrode UE1, UE2 or UE3 may not reach the side surface SF in such a portion. As described above, the upper electrodes UE1, UE2 and UE3 function as the etching stoppers of the dry etching for the sealing layers SE1, SE2 and SE3, respectively. If the upper electrode UE1, UE2 or UE3 does not reach the side surface SF, and the rib 5 is exposed, the rib 5 may also corrode in the dry etching for the sealing layers SE1, SE2 and SE3, and a penetration path for moisture to the lower side of the rib 5 may be formed. However, if the protrusion PT has a constant width over the whole circumference, the upper electrodes UE1, UE2 and UE3 are in contact with the side surface SF as a whole around the pixel apertures AP1, AP2 and AP3, thereby preventing the exposure of the rib 5. As a result, the formation of the penetration path for moisture described above is prevented. Thus, the reliability of the display device DSP is improved.

If the width of the protrusion PT is locally too less, the organic layers OR1, OR2 and OR3 may be in contact with the side surface SF in such a portion. If the lower portion 61 is electrically connected to the organic layers OR1, OR2 and OR3 (especially, the hole injection layer or the hole transport layer) because of this structure, a display failure may occur. However, if the protrusion PT has a constant width over the whole circumference like the present embodiment, the organic layers OR1, OR2 and OR3 can be spaced apart from the side surface SF as a whole around the pixel apertures AP1, AP2 and AP3. As a result, a display failure is prevented. Thus, the reliability of the display device DSP is improved.

As shown in the example of FIG. 6, in the present embodiment, the curvature in the second corner portion C2 of each of the pixel apertures AP1, AP2 and AP3 is greater than that of the end portion EP in the first corner portion C1. In this configuration, compared with a case where the curvature of each of the pixel apertures AP1, AP2 and AP3 in the second corner portion C2 is less, the areas of the pixel apertures AP1, AP2 and AP3 can be increased, and thus, the aperture ratios of subpixels SP1, SP2 and SP3 can be increased.

Figure 18:
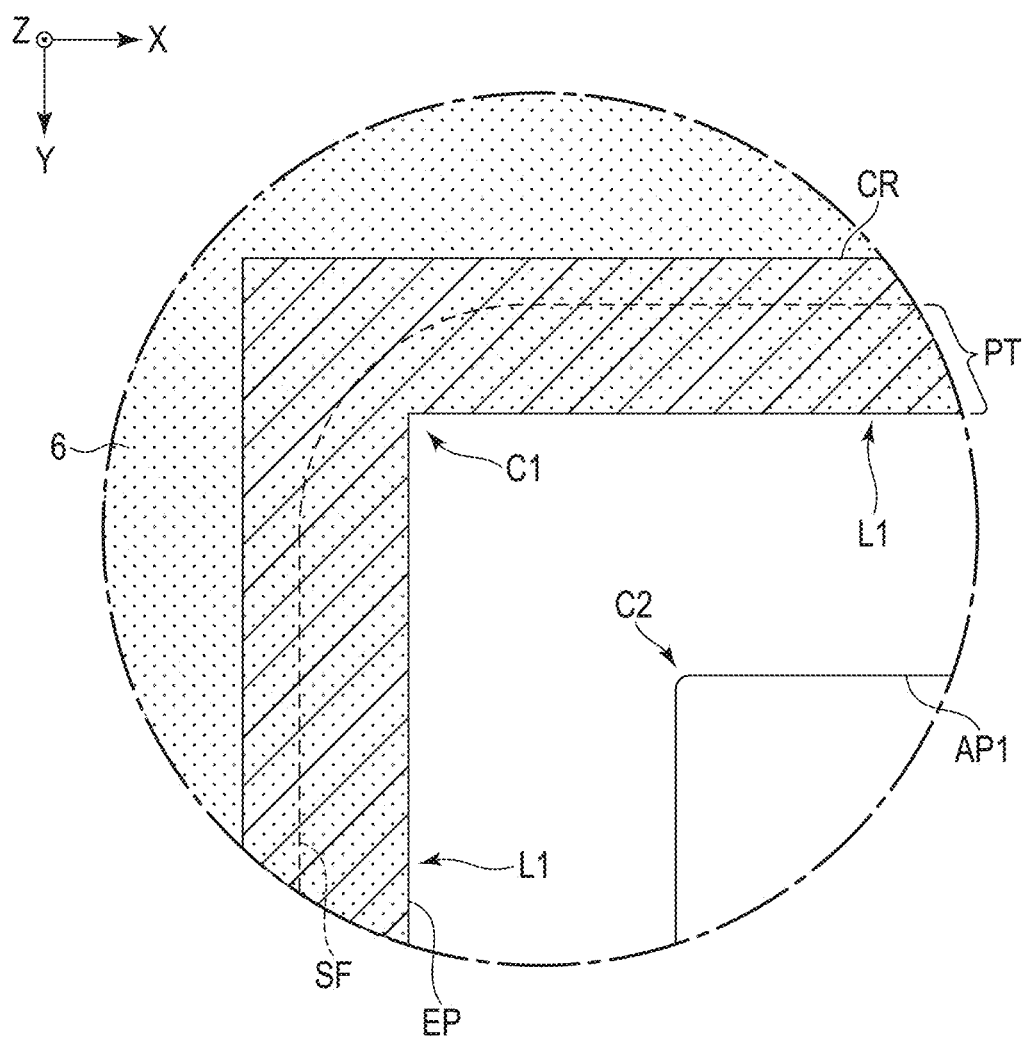
FIG. 18 is a diagram showing a comparative example of the embodiment.

FIG. 18 is a diagram showing a comparative example of the present embodiment. This figure shows the schematic planar shape of the partition 6 in a manner similar to that of FIG. 6. In this comparative example, the end portion EP of the protrusion PT in the first corner portion C1 is not arcuate and forms substantially a right angle.

In this case, the width of the protrusion PT in the first corner portion C1 is less than that of the protrusion PT in the first linear portion L1. Thus, as described above, the risk of the conduction between the lower portion 61 and the organic layers OR1, OR2 and OR3 is increased.

In the present embodiment, as shown in FIG. 6, since the end portion EP is arcuate in the first corner portion C1, the width of the protrusion PT in the first corner portion C1 is equal to the width in the first linear portion L1.

As isotropic wet etching is necessary for processing the lower portion 61, it is difficult to make the side surface SF in the first corner portion C1 have the steep shape of the end portion EP of the comparative example. Thus, to make the width of the protrusion PT constant by shaping the side surface SF in accordance with the shape of the end portion EP of the comparative example is not realistic.

To the contrary, as the upper portion 62 is thinner than the lower portion 61, and further, the first thin film 621 is processed by anisotropic dry etching, the control of the shape of the end portion EP is relatively easy. Thus, when the end portion EP is made arcuate in the first corner portion C1 as shown in FIG. 6, the width of the protrusion PT can be accurately controlled.

In the present embodiment, when the description "the width of the protrusion PT is constant over the whole circumference" is used, this specification intends to indicate both a case where the width of the protrusion PT does not vary at all over the whole circumference and a case where, even if the width of the protrusion PT slightly varies, the widths at some positions are substantially equal to each other. In other words, the expression "the width of the protrusion PT is constant over the whole circumference" means that, for example, the case where the width of the protrusion PT is considerably decreased near the first corner portion C1 as shown in FIG. 18 is excluded. For example, even when the width of the protrusion PT varies by approximately 10% at a maximum, this width of the protrusion PT is included in the scope of the term "constant" in the present embodiment.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:
   a lower electrode;
   a rib which covers a part of the lower electrode and comprises a pixel aperture overlapping the lower electrode;

a partition which is provided on the rib and surrounds the pixel aperture;
an upper electrode which faces the lower electrode; and
an organic layer which is provided between the lower electrode and the upper electrode and emits light based on a potential difference between the lower electrode and the upper electrode, wherein
the partition includes:
  a conductive lower portion comprising an annular side surface which surrounds the pixel aperture; and
  an upper portion comprising an annular protrusion which protrudes from the side surface,
the upper electrode is in contact with the side surface of the lower portion, and
the protrusion has a constant width over a whole circumference.

2. The display device of claim 1, wherein
an inner peripheral portion of the partition surrounding the pixel aperture comprises, as seen in plan view, a plurality of first linear portions, and a plurality of first corner portions each connecting adjacent two first linear portions of the plurality of first linear portions,
in the first linear portions, the side surface and an end portion of the protrusion linearly extend, and
in the first corner portions, the side surface and the end portion of the protrusion arcuately extend.

3. The display device of claim 2, wherein
a curvature of the end portion of the protrusion in the first corner portions is greater than a curvature of the side surface in the first corner portions.

4. The display device of claim 3, wherein
the pixel aperture comprises, as seen in plan view, a plurality of second linear portions parallel to the first linear portions, respectively, and a plurality of second corner portions each connecting adjacent two second linear portions of the plurality of second linear portions, and
the curvature of the end portion of the protrusion in the first corner portions is less than a curvature of the pixel aperture in the second corner portions.

5. The display device of claim 2, wherein
in each of the first linear portions and the first corner portions, part of the organic layer covers an upper surface of the protrusion.

6. The display device of claim 2, further comprising:
a cap layer which covers the upper electrode; and
a sealing layer which covers the cap layer, and continuously covers the side surface and the protrusion in each of the first linear portions and the first corner portions.

7. The display device of claim 1, wherein
the upper portion is thinner than the lower portion.

* * * * *